United States Patent
Kokudo et al.

(10) Patent No.: US 10,598,844 B2
(45) Date of Patent: Mar. 24, 2020

(54) WAVELENGTH CONVERSION MEMBER, AND LIGHT-EMITTING APPARATUS, LIGHT-EMITTING ELEMENT, LIGHT SOURCE APPARATUS, AND DISPLAY APPARATUS USING SAME

(71) Applicant: NS MATERIALS INC., Fukuoka (JP)

(72) Inventors: Shingo Kokudo, Fukuoka (JP); Akiharu Miyanaga, Fukuoka (JP); Eiichi Kanaumi, Fukuoka (JP); Tetsuji Ito, Fukuoka (JP); Yoshikazu Nageno, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 54 days.

(21) Appl. No.: 15/504,200

(22) PCT Filed: Aug. 18, 2015

(86) PCT No.: PCT/JP2015/073061
§ 371 (c)(1),
(2) Date: Feb. 15, 2017

(87) PCT Pub. No.: WO2016/027789
PCT Pub. Date: Feb. 25, 2016

(65) Prior Publication Data
US 2017/0269280 A1    Sep. 21, 2017

(30) Foreign Application Priority Data
Aug. 22, 2014   (JP) .................................. 2014-169531

(51) Int. Cl.
*F21V 8/00*   (2006.01)
*H01L 33/50*  (2010.01)
(Continued)

(52) U.S. Cl.
CPC ..... *G02B 6/0026* (2013.01); *G02F 1/133621* (2013.01); *H01L 33/483* (2013.01);
(Continued)

(58) Field of Classification Search
CPC ................ G02B 6/0026; G02B 6/0023; G02F 1/133621; H01L 33/483; H01L 33/501
(Continued)

(56) References Cited

U.S. PATENT DOCUMENTS 7,432,642 B2 * 10/2008 Murazaki ........... C09K 11/0883
                                                252/301.4 H
8,115,217 B2 *  2/2012 Duong .................... H01L 33/20
                                                      257/88
(Continued)

FOREIGN PATENT DOCUMENTS

| EP | 2650720 | 10/2013 |
|---|---|---|
| JP | 2009-071005 | 4/2009 |

(Continued)

OTHER PUBLICATIONS

Extended European Search Report for European Application No. 15 833902.8 dated Feb. 1, 2018.
(Continued)

*Primary Examiner* — Andrew J Coughlin
(74) *Attorney, Agent, or Firm* — Greenblum & Bernstein, P.L.C.

(57) ABSTRACT

It is an object of the present invention to provide a wavelength conversion member capable of appropriately performing color conversion compared to the prior arts and a light-emitting apparatus, a light-emitting element, a light source apparatus, and a display apparatus using the wavelength conversion member. A wavelength conversion member of the present invention includes a light incident surface, a light emission surface and a side face that connects (Continued)

between the light incident surface and the light emission surface, and includes a container provided with a storage space inside the side face, a wavelength conversion substance that fills the inside of the storage space and a colored layer formed on the side face.

20 Claims, 14 Drawing Sheets

(51) Int. Cl.
*G02F 1/1335* (2006.01)
*H01L 33/48* (2010.01)
*F21K 9/64* (2016.01)
*F21Y 115/10* (2016.01)

(52) U.S. Cl.
CPC .......... *H01L 33/501* (2013.01); *H01L 33/505* (2013.01); *F21K 9/64* (2016.08); *F21Y 2115/10* (2016.08); *G02F 2001/133614* (2013.01); *H01L 33/502* (2013.01); *H01L 33/507* (2013.01)

(58) Field of Classification Search
USPC ........................................................ 362/608
See application file for complete search history.

(56) References Cited

U.S. PATENT DOCUMENTS

| | | | |
|---|---|---|---|
| 9,316,388 B2* | 4/2016 | Pastrik | G03B 21/16 |
| 10,268,073 B2* | 4/2019 | Wu | G02F 1/133603 |
| 2004/0032728 A1* | 2/2004 | Galli | H01L 33/60 |
| | | | 362/84 |
| 2004/0222426 A1* | 11/2004 | Hsiung | H01L 33/54 |
| | | | 257/79 |
| 2009/0273727 A1* | 11/2009 | Kubota | G02B 5/265 |
| | | | 349/62 |
| 2010/0046234 A1* | 2/2010 | Abu-Ageel | G02B 3/0006 |
| | | | 362/308 |
| 2013/0114301 A1* | 5/2013 | Um | G02B 6/0023 |
| | | | 362/621 |
| 2013/0271961 A1* | 10/2013 | Nakamura | F21V 9/00 |
| | | | 362/97.2 |
| 2013/0294107 A1 | 11/2013 | Ohkawa et al. | |
| 2014/0133159 A1 | 5/2014 | Asano et al. | |
| 2014/0307465 A1 | 10/2014 | Choi et al. | |
| 2015/0214445 A1* | 7/2015 | Qiu | H01L 27/15 |
| | | | 257/88 |

FOREIGN PATENT DOCUMENTS

| | | |
|---|---|---|
| JP | 2013-16583 | 1/2013 |
| JP | 2013-068728 | 4/2013 |
| JP | 2013-115351 | 6/2013 |
| JP | 2013-218954 | 10/2013 |
| TW | 201331647 A1 | 8/2013 |

OTHER PUBLICATIONS

International Search Report (ISR) issued in International Patent Application No. PCT/JP2015/073061, dated Oct. 27, 2015.

U.S. Appl. No. 15/522,362 to Akiharu Miyanaga et al., filed Apr. 27, 2017.

U.S. Appl. No. 15/522,398 to Akiharu Miyanaga et al., filed Apr. 27, 2017.

* cited by examiner

WAVELENGTH CONVERSION MEMBER, AND LIGHT-EMITTING APPARATUS, LIGHT-EMITTING ELEMENT, LIGHT SOURCE APPARATUS, AND DISPLAY APPARATUS USING SAME

TECHNICAL FIELD

The present invention relates to a wavelength conversion member, a container of which is filled with a wavelength conversion substance, and a light-emitting apparatus, a light-emitting element, a light source apparatus and a display apparatus using the same.

BACKGROUND ART

For example, Patent Literature 1 below discloses an invention relating to a light-emitting apparatus provided with a light source, a wavelength conversion member and a light-guiding plate or the like.

The wavelength conversion member is provided between the light source and the light-guiding plate to absorb light having a wavelength emitted from the light source and then generate light having a wavelength different from that of the light from the light source. With the wavelength conversion member, a wavelength conversion substance is sealed in a cylindrical container made of glass or the like. Examples of the wavelength conversion substance include fluorescent pigment, fluorescent dye or quantum dots. For example, the wavelength conversion substance absorbs blue light of the light source and converts part of the blue light to red light or green light. [0015] to [0017] of Patent Literature 1 describes that when the light of the light source passes through the wavelength conversion substance, light beams of red, green and blue colors are synthesized and white light is thereby generated.

CITATION LIST

Patent Literature

Patent Literature 1:
Japanese Patent Application Laid-Open No. 2013-218954

SUMMARY OF INVENTION

Technical Problem

However, it has been proven that with the configuration shown in Patent Literature 1, the hue of the light that has passed through the wavelength conversion member from the light source is similar to the light source color and has not been color-converted appropriately. The light from the light source also passes through the inside of a side part of the container located on one lateral side of the wavelength conversion substance. For this reason, the light that has passed through the wavelength conversion substance is mingled with the light that has passed through the inside of the side part of the container without passing through the interior of the wavelength conversion substance on the light emission surface of the wavelength conversion member, and the synthetic color becomes a hue similar to the light source color.

Therefore, as described above, even when the blue light of the light source is passed through the wavelength conversion member to convert it to white light, the blue light has not been successfully converted to white light appropriately.

The present invention has been implemented in view of the above problems, and it is an object of the present invention to provide a wavelength conversion member which can perform color conversion more appropriately and with higher efficiency, and a light-emitting apparatus, a light-emitting element, a light source apparatus and a display apparatus using the same.

Solution to Problem

A wavelength conversion member of the present invention includes a container provided with a first surface, a second surface facing the first surface and a side face connecting between the first surface and the second surface, the container being provided with a storage space inside the side face, a wavelength conversion substance disposed in the storage space, and a colored layer formed on the side face, an end portion of the second surface or from the side face to the end portion of the second surface.

A wavelength conversion member of the present invention includes a container provided with a first surface, a second surface facing the first surface and a side face connecting between the first surface and the second surface, the container being provided with a storage space inside the side face, a wavelength conversion substance disposed in the storage space, and a colored layer formed on a wall surface in the storage space.

A wavelength conversion member of the present invention includes a container provided with a first surface, a second surface facing the first surface and a side face connecting between the first surface and the second surface, the container being provided with a storage space inside the side face, a wavelength conversion substance disposed in the storage space, and a colored layer formed between the side face of the container and the storage space.

Furthermore, in the present invention, the wavelength conversion substance preferably contains quantum dots. Furthermore, in the present invention, the wavelength conversion substance is preferably formed of a resin composition in which the quantum dots are dispersed. In this case, the wavelength conversion substance is preferably formed of a resin composition in which the quantum dots are dispersed in silicone resin.

Furthermore, in the present invention, outer shape cross sections of the storage space and the container obtained by cutting the first surface and the second surface by a plane perpendicular to at least one of the first surface and the second surface are preferably rectangular.

Furthermore, in the present invention, the colored layer is preferably colored in white color. Furthermore, in the present invention, the colored layer is preferably formed of paint, ink or tape. Furthermore, in the present invention, a refractive index of resin that forms the wavelength conversion substance is preferably smaller than a refractive index of the container.

Furthermore, a light-emitting apparatus according to the present invention is constructed of a light-emitting element provided opposite to the first surface and any one of the above-described wavelength conversion members disposed on a light emission side of the light-emitting element.

Furthermore, a light-emitting element according to the present invention is constructed of a light-emitting chip that emits blue light and any one of the above-described wavelength conversion members disposed on a light emission side of the light-emitting chip.

Furthermore, a light source apparatus according to the present invention is constructed of the above-described light-emitting apparatus or the above-described light-emitting element and a light-guiding plate.

Furthermore, a display apparatus according to the present invention is constructed of a display section, the above-described light-emitting apparatus disposed on the rear surface side of the display section or the above-described light-emitting element.

Advantageous Effects of Invention

The wavelength conversion member according to the present invention can perform color conversion more appropriately and with high efficiency than the prior art. The light-emitting apparatus, the light-emitting element, the light source apparatus and the display apparatus according to the present invention are all provided with the wavelength conversion member according to the present invention. Therefore, it is possible to perform color conversion to a desired color or a color closer to the desired color through the wavelength conversion member appropriately and with high efficiency and improve reliability as the apparatus. This makes it possible to reduce power consumption.

DESCRIPTION OF EMBODIMENTS

Hereinafter, embodiments of the present invention will be described in detail. Note that the present invention is not limited to the following embodiments, but can be implemented modified in various ways without departing from the spirit and scope of the present invention.

Figure 1:
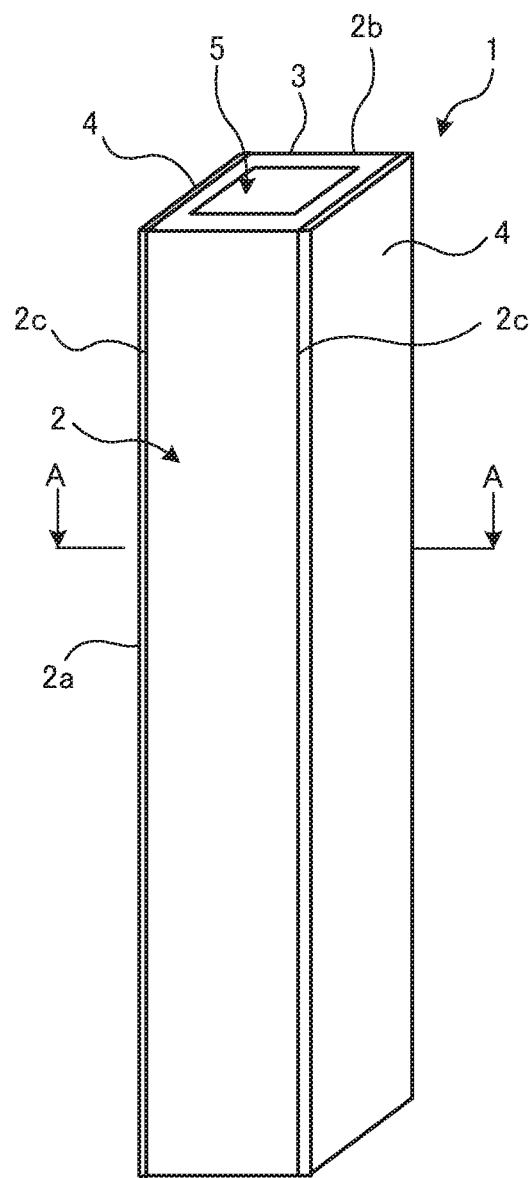
FIG. 1 is a perspective view of a wavelength conversion member illustrating a first embodiment according to the present invention.
Figure 2:
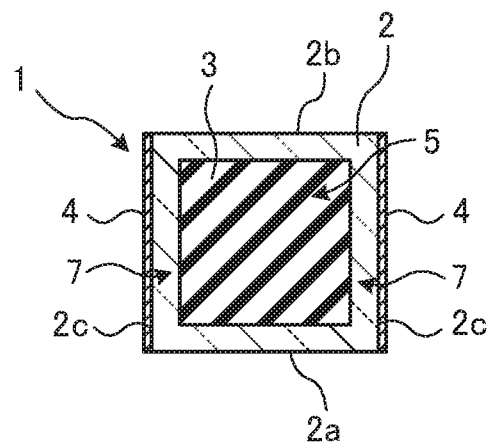
FIG. 2 is a cross-sectional view of the wavelength conversion member shown in FIG. 1, cut along a line A-A in a plane direction and seen from a direction indicated by arrows.

FIG. 1 is a perspective view of a wavelength conversion member illustrating a first embodiment according to the present invention. FIG. 2 is a cross-sectional view of the wavelength conversion member shown in FIG. 1 cut along a line A-A in a plane direction and seen from a direction indicated by arrows As shown in FIG. 1 and FIG. 2, a wavelength conversion member 1 according to a first embodiment is constructed of a container 2, a wavelength conversion substance 3 and a colored layer 4.

The container 2 can store and retain the wavelength conversion substance 3. The container 2 is preferably a transparent member. The term "transparent" refers to what is generally recognized as being transparent or what has a visible light transmittance of approximately 50% or more.

As shown in FIG. 1 and FIG. 2, the container 2 is provided with a light incident surface 2a, a light emission surface 2b, and side faces 2c that connects between the light incident surface 2a and the light emission surface 2b. As shown in FIG. 1 and FIG. 2, the light incident surface 2a and the light emission surface 2b are located opposite to each other.

As shown in FIG. 1 and FIG. 2, a storage space 5 is formed in the container 2 inside the light incident surface 2a, the light emission surface 2b and the side faces 2c. The storage space 5 needs only to be located at least inside the side faces 2c. That is, for example, part of the storage space 5 may reach the light incident surface 2a and the light emission surface 2b.

The wavelength conversion substance 3 is disposed in the storage space 5. As shown in FIG. 1, the storage space 5 has an opening, from which the wavelength conversion substance 3 is sealed in the storage space 5 to fill the storage space 5.

The longitudinal and lateral sizes of the container 2 are on the order of several mm to several tens of mm, and the longitudinal and lateral sizes of the storage space 5 are on the order of several hundreds of μm to several mm.

As shown in FIG. 2, in a cross-sectional shape of the wavelength conversion member, cut by a plane perpendicular to at least one of the light incident surface 2a and the light emission surface 2b, an outer shape cross section of the storage space 5 and an outer shape cross section of the container 2 are both formed into a rectangular shape. Such a cross section is a plane, cut in a direction in which the light incident surface 2a, the light emission surface 2b and the side faces 2c appear. Here, the term "rectangular" means a form whose four vertices are substantially perpendicular to each other and includes a square and a rectangle.

As shown in FIG. 2, an outer shape cross section of the storage space 5 is preferably similar to an outer shape cross section of the container 2.

The container 2 shown in FIG. 1 and FIG. 2 is, for example, a glass tube container such as a glass capillary. However, the container 2 may be made of resin or the like as long as a container having excellent transparency can be configured.

The wavelength conversion substance 3 shown in FIG. 1 and FIG. 2 preferably contains a substance that absorbs blue light and emits red light, and a substance that absorbs blue light and emits green light. To be more specific, the wavelength conversion substance 3 preferably contains quantum dots. As the wavelength conversion substance 3, fluorescent pigment, fluorescent dye or the like other than quantum dots may be used, but the wavelength conversion substance 3 containing quantum dots excels in a wavelength conversion characteristic.

The wavelength conversion substance 3 is preferably formed of a resin composition in which quantum dots are dispersed. As resin, it is possible to use polypropylene, polyethylene, polystyrene, AS resin, ABS resin, methacryl resin, polyvinyl chloride, polyacetal, polyamide, polycarbonate, modified polyphenylene ether, polybutylene terephthalate, polyethylene terephthalate, polysulfone, polyethersulphone, polyphenylene sulfide, polyamide imide, polymethyl pentene, liquid crystal polymer, epoxy resin, phenol resin, urea resin, melamine resin, epoxy resin, diallyl phthalate resin, unsaturated polyester resin, polyimide, polyurethane, silicone resin, or a mixture of some of these substances. Among them, it is suitable to form a resin composition in which quantum dots are dispersed using silicone resin or epoxy resin. More preferably, a resin composition is formed in which quantum dots are dispersed using silicone resin.

Furthermore, a refractive index of the resin that forms the wavelength conversion substance 3 is preferably smaller than a refractive index of the container 2. For example, the refractive index of silicone resin for sodium D line, at 23° C. is 1.52 with SCR1016 manufactured by Shin-Etsu Chemical Co., Ltd., 1.55 with A2045 manufactured by Daicel Corporation, 1.41 with KER-2500 manufactured by Shin-Etsu Chemical Co., Ltd., and 1.41 with A1080 manufactured by Daicel Corporation. Furthermore, the refractive index of epoxy resin for sodium D line, at 23° C. is 1.51 with SELVENUS WO917 and 1.50 with SELVENUS WO925 manufactured by Daicel Corporation. In contrast, the refractive index of the container 2 made of glass is around 1.45 in the case of general glass and on the order of 1.50 to 1.90 in the case of optical glass having a high refractive index. Therefore, by appropriately selecting resin that forms the wavelength conversion substance 3 and a material of the container 2, it is possible to make the refractive index of the resin that forms the wavelength conversion substance 3 smaller than the refractive index of the container 2. For example, as the resin that forms the wavelength conversion substance 3, it is possible to use A1080 or KER-2500 which is silicone resin having a refractive index of 1.41 and it is possible to form the container 2 of glass having a refractive index of 1.45. Furthermore, as another example, it is possible to use silicone resin or epoxy resin having a refractive index of 1.41 to 1.55 as resin that forms the wavelength conversion substance 3 and form the container 2 of glass having a high refractive index equal to or higher than 1.56. Thus, part of light entering the wavelength conversion substance 3 is totally reflected by the side wall part of the container 2 facing the storage space 5. This is because the angle of incidence on the medium side which has a smaller refractive index is greater than the angle of incidence on the medium side having a greater refractive index. This makes it possible to reduce the amount of light that leaks outward from one side of the container 2 and thereby increase color conversion efficiency and light emission intensity. Note that the resin that forms the wavelength conversion substance 3 referred to here is not limited to resin for dispersing quantum dots.

Moreover, the configuration and material of quantum dots contained in the wavelength conversion substance 3 are not limited, but, for example, quantum dots in the present embodiment can include cores of semiconductor particles and shell parts that cover the periphery of the cores. For example, CdSe is used for the core but the material is not particularly limited. For example, a core member containing at least Zn and Cd, a core member containing Zn, Cd, Se and S, ZnCuInS, CdS, CdSe, ZnS, ZnSe, InP, CdTe, and composites of them, or the like can be used. Quantum dots of the present embodiment may be configured without forming the shell part but with only the core part of semiconductor particles. That is, quantum dots may not be provided with a coating structure made up of the shell part if only provided with at least the core part. For example, when the core part is coated by the shell part, the region which becomes the coating structure may be too small or the coated part may be too thin to analyze or confirm the coating structure. Therefore, quantum dots can be judged regardless of the presence/absence of the shell part by an analysis.

As the quantum dots, two types of quantum dots are included; quantum dots having an absorption wavelength of 460 nm (blue color) and a fluorescence wavelength of approximately 520 nm (green color), and quantum dots having approximately 660 nm (red color). For this reason, when blue light is made incident from the light incident surface 2a, part of blue color is converted to green color or red color by the respective quantum dots. In this way, white light can be obtained from the light emission surface 2b. However, blue light has not been successfully converted to white light appropriately in the prior arts. This is because when blue light passes through the side region 7 (see FIG. 2) between the storage space 5 filled with the wavelength conversion substance 3 and the side face 2c from the incident surface 2a to the light emission surface 2b, the wavelength intensity of blue light is intensified at the light emission surface 2b.

Thus, colored layers 4, 4 are provided in the side faces 2c, 2c as shown in FIG. 1 and FIG. 2 in the present embodiment. The "colored layer" is a non-transparent layer and refers to a layer colored with a color including white color. The colored layer 4 is preferably composed of a dye, ink or tape. Although the color of the colored layer 4 is not limited but white color is suitable. Therefore, the colored layer 4 can be simply formed by only applying a white dye or white ink to the side face 2c or pasting white tape to the side face 2c.

Moreover, metal such as Ni, Ag, Al, Cr or the like may be vapor-deposited to form the metal layer 4.

This makes it possible to suppress leakage of light that passes through a lateral region 7 compared to the prior arts and perform color conversion more appropriately and with higher efficiency than the prior arts, and obtain light of desired color from the light emission surface 2b. According to the present embodiment, it is possible to make light emission intensity of white light equal to or greater than that in the prior art.

Figure 3A:
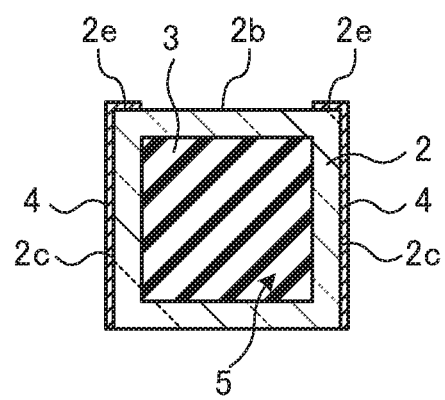
FIG. 3A is a cross-sectional view of a wavelength conversion member having a cross-sectional shape different from FIG. 2.
Figure 3B:
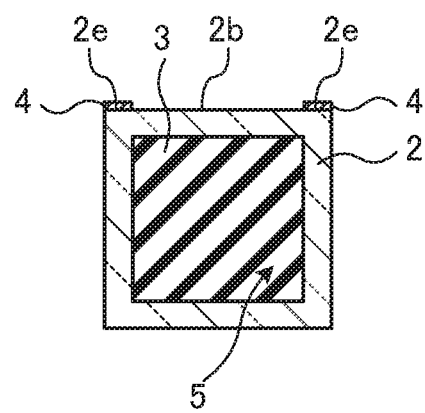
FIG. 3B is a cross-sectional view of a wavelength conversion member having a cross-sectional shape different from FIG. 2.

In FIG. 1 and FIG. 2, the colored layer 4 is formed on the side face 2c of the container 2, but as shown in FIG. 3A, the colored layer 4 can also be formed from the side face 2c of the container 2 to an end portion 2e of the light emission surface 2b. Alternatively, as shown in FIG. 3B, the colored layer 4 can be formed only in the end portion 2e of the light emission surface 2b. The colored layer 4 is preferably formed on the side face 2c of the container 2 as shown in FIG. 2 or from the side face 2c of the container 2 to the end portion 2e of the light emission surface 2b as shown in FIG. 3A.

The end portion 2e of the light emission surface 2b faces the lateral region 7 between the storage space 5 and the side face 2c. Thus, the end portion 2e does not face the storage space 5 filled with the wavelength conversion substance 3. Therefore, the colored layer 4 provided at the end portion 2e of the light emission surface 2b is located on both sides of the storage space 5 filled with the wavelength conversion substance 3 and preferably does not face the storage space 5, but the colored layer 4 may be formed in a slightly greater length on the light emission surface 2b and may partially face the storage space 5. For example, if the colored layer 4 faces approximately ⅓ or less of the width of the storage space 5, the colored layer 4 is included in an allowable range.

Note that the colored layer 4 is preferably formed on an entire surface of the side face 2c or the end portion 2e, but the colored layer 4 need not always be formed on the entire surface and may be part of the side face 2c or end portion 2e. However, the area of 50% or more of the side face 2c or the end portion 2e may be preferably covered with the colored layer 4. Instead of being formed on the lateral region 7, the colored layer 4 may be formed using a colored material for the whole or part of the lateral region 7. For example, the colored layer 4 may also be formed using white glass or white resin for the whole or part of the lateral region 7.

Figure 4A:
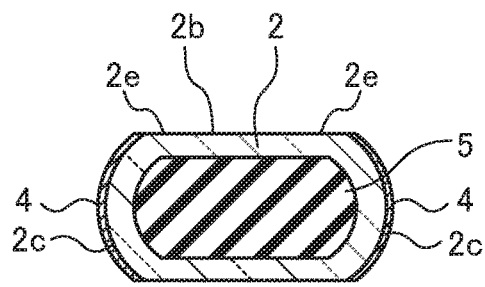
FIG. 4A is a cross-sectional view of a wavelength conversion member illustrating a cross-sectional shape different from FIG. 2, FIG. 3A and FIG. 3B.

As shown in FIG. 2, FIG. 3A and FIG. 3B, the outer shapes of the container 2 and the storage space 5 preferably have rectangular cross-sectional shapes. However, the side face 2c of the container 2 and the side wall surface of the storage space 5 may be configured as a curved surface or elliptic as shown FIG. 4A.

Figure 4B:
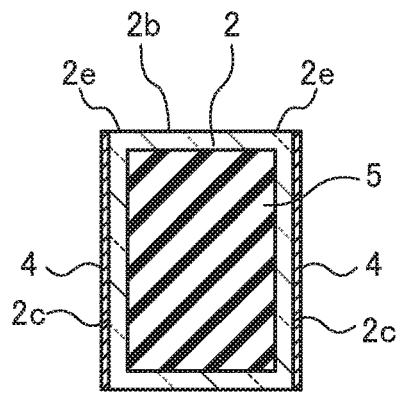
FIG. 4B is a cross-sectional view of a wavelength conversion member illustrating a cross-sectional shape different from FIG. 2, FIG. 3A and FIG. 3B.

The outer shapes of the container 2 and the storage space 5 in FIG. 2, FIG. 3A and FIG. 3B are square, whereas as shown in FIG. 4B, the outer shapes of the container 2 and the storage space 5 may be rectangular.

Rather than the cross-sectional shape including the curved surface, the rectangular cross-sectional shape as shown in FIG. 2 and FIG. 4B makes it possible to appropriately display effects of providing the colored layer 4 of the present embodiment (the ability to perform color conversion appropriately and with high efficiency and the ability to obtain light of desired color compared to the prior arts).

Figure 4C:
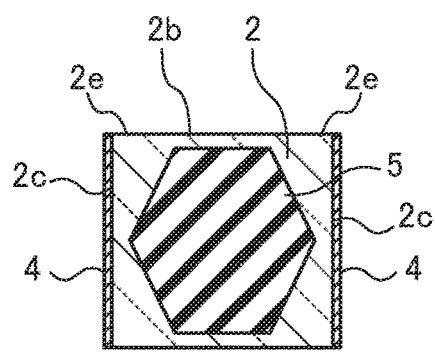
FIG. 4C is a cross-sectional view of a wavelength conversion member illustrating a cross-sectional shape different from FIG. 2, FIG. 3A and FIG. 3B.
Figure 4D:
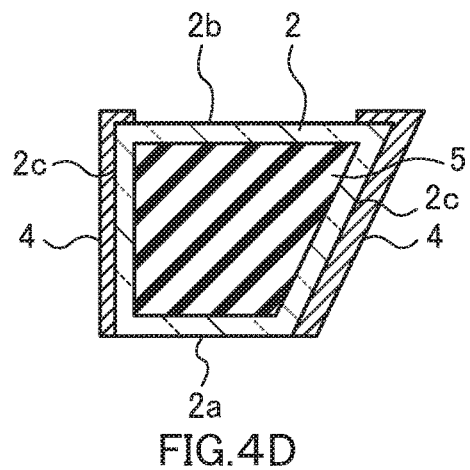
FIG. 4D is a cross-sectional view of a wavelength conversion member illustrating a cross-sectional shape different from FIG. 2, FIG. 3A and FIG. 3B.

In FIG. 2, FIG. 3A, FIG. 3B, FIG. 4A and FIG. 4B, cross-sectional outer shapes of the container 2 and the storage space 5 are assumed to be mutually similar, whereas as shown in FIG. 4C, the cross-sectional outer shape of the container 2 may be different from the cross-sectional outer shape of the storage space 5. For example, in FIG. 4C, the cross-sectional outer shape of the container 2 is rectangular and the cross-sectional outer shape of the storage space 5 is hexagonal. However, adopting mutually similar shapes as the cross-sectional outer shapes of the container 2 and the storage space 5 may lead to appropriate exhibition of the effects of providing the colored layer 4 of the present embodiment (the ability to perform color conversion appropriately and with high efficiency and the ability to obtain light of desired color compared to the prior arts) and is therefore preferable. Furthermore, as shown in FIG. 4D, the cross-sectional outer shapes of the container 2 and the storage space 5 may be mutually similar trapezoidal shapes. For example, in FIG. 4D, the short side of the trapezoid is designated as the light incident surface 2a and the long side is designated as the light emission surface 2b. This makes it possible to magnify the light emitted from the light source to a predetermined magnitude. As another example, contrary to FIG. 4D, the long side of the trapezoid may be designated as the light incident surface 2a and the short side may be designated as the light emission surface 2b. This makes it possible to condense the light emitted from the light source to a predetermined magnitude. Furthermore, unlike FIG. 4D, the cross-sectional outer shapes of the container 2 and the storage space 5 may be configured such that the sides are formed at positions mutually linearly symmetric with respect to the central line that passes through the center of the upper base and the lower base of the trapezoid.

In the respective drawings of FIG. 2, FIG. 3A, FIG. 3B and FIG. 4A to FIG. 4D, the light incident surface and the light emission surface are formed of planar surfaces, but any one or both of the light incident surface and the light emission surface may be formed of a curved surface. In the respective drawings of FIG. 2, FIG. 3A, FIG. 3B, FIG. 4B to FIG. 4D, the side faces of the container 2 are formed of planar surfaces, but the side faces may be formed of a curved surface. Furthermore, each corner between the sides may be formed into an R shape. That is, expressions such as rectangular, hexagonal, trapezoidal are not limited to geometrically accurate rectangular, hexagonal, trapezoidal, and the lines and angles that make up these figures include distortion or errors as well. The direction of light emitted can be adjusted by these lines and angles.

In the respective drawings of FIG. 4A to FIG. 4D, the colored layers 4 are all formed on the side faces 2c of the container 2, but as shown in FIG. 3A, the colored layer 4 can be provided from the top of the side face 2c of the container 2 to the top of the end portion 2e of the light emission surface 2b or as shown in FIG. 3B, the colored layer 4 can be provided at the end portion 2e of the light emission surface 2b.

Figure 5:
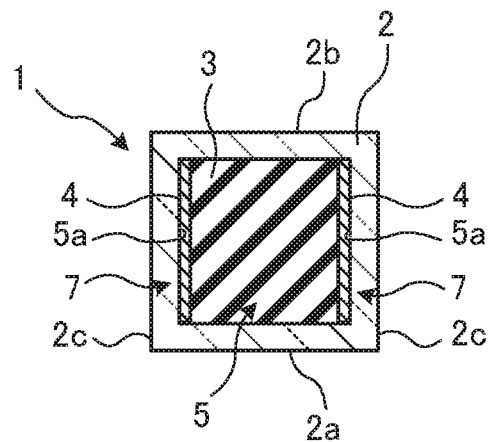
FIG. 5 is a cross-sectional view of a wavelength conversion member illustrating a cross-sectional shape different from FIG. 2.

As described above, the colored layer 4 is formed on an outer surface of the container 2, but as shown in FIG. 5, the colored layer 4 may be formed on a wall surface 5a of an inner space 5. The wall surface 5a on which the colored layer 4 is formed is located at a position facing the side face 2c of the container 2.

Figure 6:
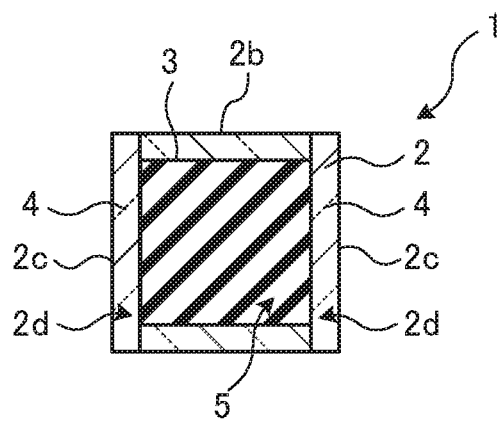
FIG. 6 is a cross-sectional view of a wavelength conversion member illustrating a cross-sectional shape different from FIG. 2.

Alternatively, as shown in FIG. 6, a side portion 2d of the container 2 between the side face 2c of the container 2 and the inner space 5 itself can be designated as the colored layer 4. In such a case, the container 2 is molded in two colors and colored resin is used for the portion of the container 2 which becomes the side portion 2d. Alternatively, the side portion 2d of the container 2 may be joined to the rest of the components using an adhesive or the like to form the container 2 shown in FIG. 6. Note that in FIG. 5 and FIG.

6, the same reference numerals as those in FIG. 2, FIG. 3A, FIG. 3B denote the same parts as those in FIG. 2, FIG. 3A and FIG. 3B.

Figure 7:
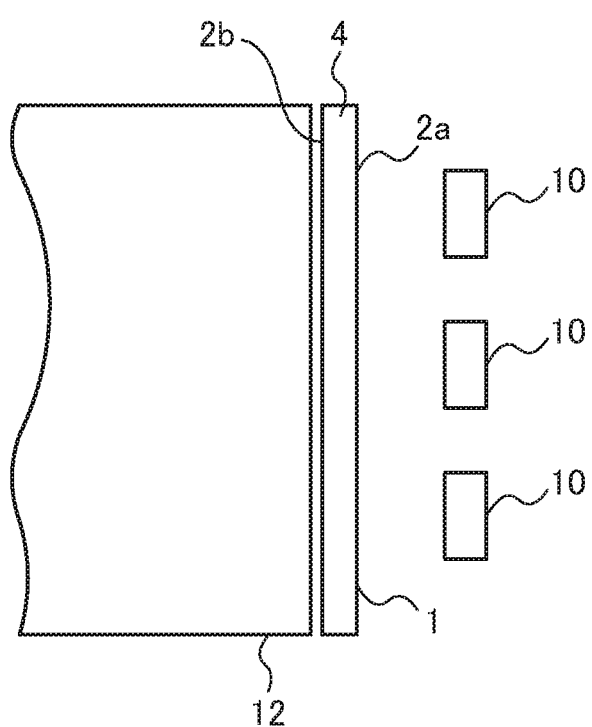
FIG. 7 is a plan view of a light-emitting apparatus and a light source apparatus using the wavelength conversion member shown in FIG. 1.

The wavelength conversion member 1 shown in FIG. 1 may be interposed between the light-emitting element 10 such as an LED and the light-guiding plate 12 as shown in FIG. 7. A combination of the wavelength conversion member 1 and the light-emitting element 10 is a light-emitting apparatus, the light-guiding plate 12 is further added to the light-emitting apparatus to form the light source apparatus. Alternatively, the wavelength conversion member 1 and the light-guiding plate 12 may be combined to form a light guiding member. The light-emitting apparatus shown in FIG. 7 can be used, for example, as a white light source of a liquid crystal display.

With the configuration shown in FIG. 7, the light emitted from the light-emitting element 10 is made incident from the light incident surface 2a of the wavelength conversion member 1, wavelength-converted by the wavelength conversion substance 3 (see FIG. 1) and the wavelength-converted light is emitted from the light emission surface 2b to the light-guiding plate 12. In FIG. 1, the colored layers 4 formed on the side faces 2c of the container 2 making up the wavelength conversion member 1 appear on the top and bottom surfaces. In the present embodiment, since the colored layers 4 are provided, it is possible to reduce the rate at which the light source light from the light-emitting element 10 passes through the lateral region of the wavelength conversion member 1 without being wavelength-converted, and it is possible to obtain light of desired color from the light emission surface 2b compared to the prior arts. For example, the light-emitting light of desired color is white light, and the light-emitting apparatus and the light source apparatus shown in FIG. 7 can increase the reliability as an apparatus capable of effectively emitting white light more than the prior arts.

Figure 8:
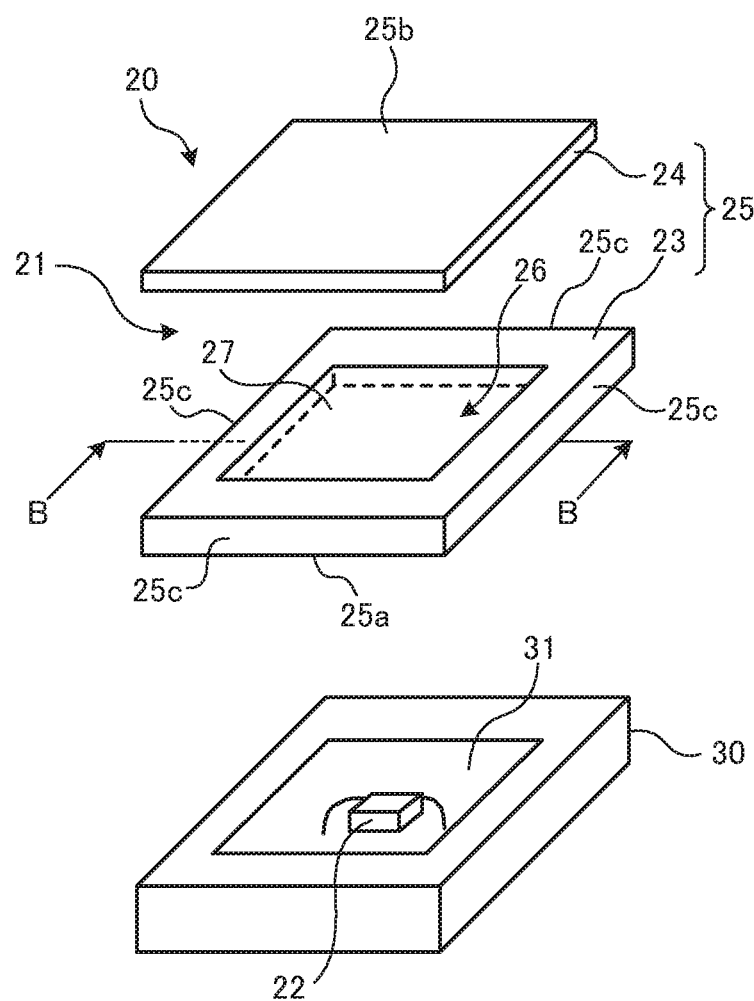
FIG. 8 is an exploded perspective view of a light-emitting element provided with a wavelength conversion member illustrating a second embodiment according to the present invention.
Figure 9:
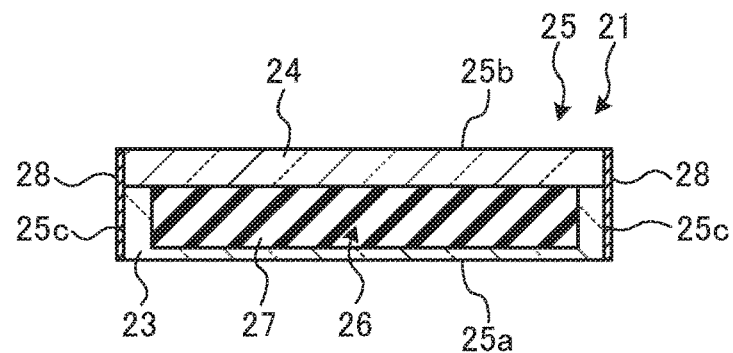
FIG. 9 is an enlarged longitudinal cross-sectional view of the wavelength conversion member shown in FIG. 8 in a combined state, cut along a line B-B in a height direction and seen from a direction indicated by arrows.
Figure 10:
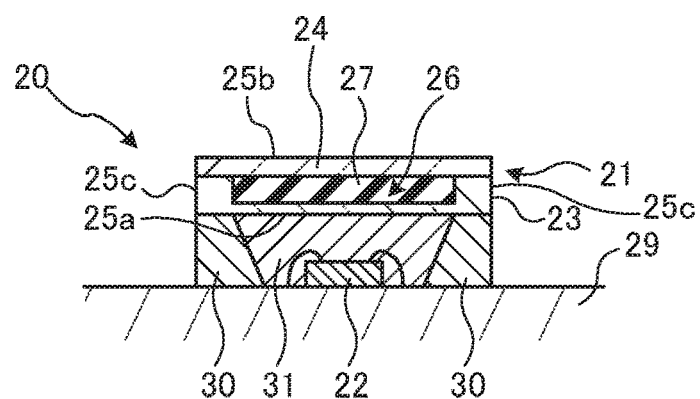
FIG. 10 is a longitudinal cross-sectional view of the light-emitting element shown in FIG. 8 with components thereof combined, cut along the line B-B shown in FIG. 8 and seen from a direction indicated by arrows.

FIG. 8 is an exploded perspective view of a light-emitting element provided with the wavelength conversion member illustrating a second embodiment of the present invention. FIG. 9 is an enlarged longitudinal cross-sectional view of the wavelength conversion member shown in FIG. 8 when the respective members are combined, cut along a line B-B in a height direction and seen from a direction indicated by arrows. FIG. 10 is a longitudinal cross-sectional view of the light-emitting element shown in FIG. 8 when the respective members are combined, cut along the line B-B shown in FIG. 8 in the height direction and seen from a direction indicated by arrows.

The light-emitting element 20 shown in FIG. 8 and FIG. 10 is constructed of a wavelength conversion member 21 and an LED chip (light-emitting chip) 22. The wavelength conversion member 21 is provided with a container 25 composed of a plurality of pieces such as a container body 23 and a lid 24. As shown in FIG. 8, FIG. 9 and FIG. 10, a bottomed storage space 26 is formed at the center of the container body 23. The storage space 26 is filled with a wavelength conversion substance 27. The lid 24 is joined onto the container body 23 via an adhesive layer (not shown). A colored layer 28 is formed on a side face 25c of the container 25.

The undersurface of the container 25 of the wavelength conversion member 21 shown in FIG. 8, FIG. 9 and FIG. 10 is a light incident surface 25a. The top surface facing the light incident surface 25a is the light emission surface 25b.

The storage space 26 is formed at a position inside the side face 25c provided in the container 25 of the wavelength conversion member 21 shown in FIG. 8, FIG. 9 and FIG. 10.

FIG. 9 illustrates the side face 25c that appears in a cross section of FIG. 8 along a line B-B, but it is also suitable to form a colored layer 28 on the other two side faces 25c (front side and rear surface side shown in FIG. 8) which do not appear on the cross section along the line B-B. Note that because of directivity of light, if it is effective to provide the colored layer 28 on a certain side face 25c, the colored layer 28 may be provided only on the certain side face 25c and no colored layer 28 may be provided on the other side faces 25c. However, the colored layers 28 are preferably provided on all the side faces 25c.

As shown in FIG. 10, the LED chip 22 is connected to a printed wiring board 29 and the LED chip 22 is surrounded by a frame body 30 as shown in FIG. 8 and FIG. 10. The inside of the frame body 30 is sealed with resin layer 31.

As shown in FIG. 10, the wavelength conversion member 21 is joined to the top surface of the frame body 30 via an adhesion layer (not shown) and a light-emitting element 20 such as an LED is formed.

Figure 11A:
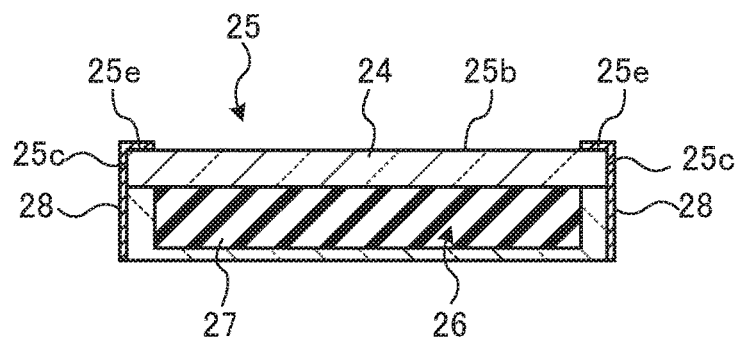
FIG. 11A is an enlarged longitudinal cross-sectional view of a wavelength conversion member illustrating a cross-sectional shape different from FIG. 9.
Figure 11B:
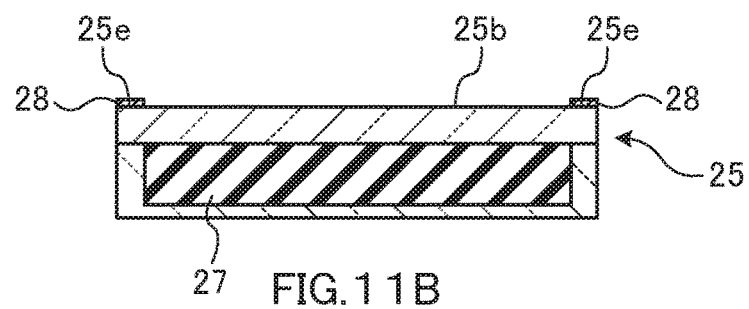
FIG. 11B is an enlarged longitudinal cross-sectional view of a wavelength conversion member illustrating a cross-sectional shape different from FIG. 9.

As shown in FIG. 11A, the colored layer 28 may be formed from the side face 25c of the container 25 of the wavelength conversion member 21 to an end portion 25e of the light emission surface 25b. Furthermore, as shown in FIG. 11B, the colored layer 28 may be formed only on the end portion 25e of the light emission surface 25b.

Figure 12:
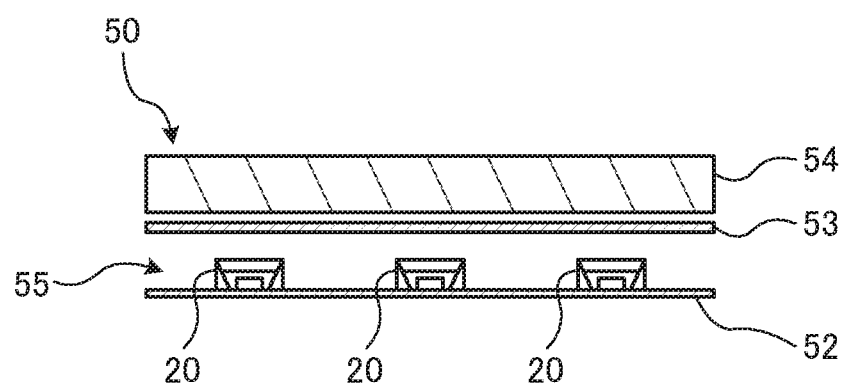
FIG. 12 is a longitudinal cross-sectional view of a display apparatus using the light-emitting element shown in FIG. 8.

FIG. 12 is a longitudinal cross-sectional view of a display apparatus using the light-emitting element shown in FIG. 8. As shown in FIG. 12, a display apparatus 50 is constructed of a plurality of light-emitting elements 20 (LEDs) and a display section 54 such as a liquid crystal display that faces the respective light-emitting elements 20. The respective light-emitting elements 20 are arranged on the rear surface side of the display section 54.

The plurality of light-emitting elements 20 are supported by a support body 52. The respective light-emitting elements 20 are arranged at a predetermined interval. Each light-emitting element 20 and the support body 52 constitute a backlight 55 for the display section 54. The shape or the material of the support body 52 is not particularly limited and can be a sheet shape, tabular shape or case shape.

As shown in FIG. 12, a light diffusion board 53 is interposed between the backlight 55 and the display section 54.

A light source apparatus can be configured by combining the light-emitting element 20 shown in FIG. 8 and FIG. 10 and the light-guiding plate 12 shown in FIG. 7. Alternatively, the light-emitting apparatus shown in FIG. 7 (provided with a light-emitting element, the capillary wavelength conversion member 1 and the light-guiding plate 12) may be disposed on the rear surface side of the display section 54 shown in FIG. 12 (insertion of the light diffusion board 53 or the like may be optional) to form the display apparatus 50.

The wavelength conversion member and the light-emitting element of the present embodiment are also applicable to a light source apparatus, an illumination apparatus, a light diffusion apparatus, a light reflection apparatus or the like in other modes in addition to the light source apparatus and the display apparatus shown above.

EXAMPLES

Hereinafter, examples and comparative examples implemented to clarify the effects of the present invention will be described in detail. Note that the present invention will not be limited by the following examples at all.

[Capillary]
Inside dimension 0.5 mm×0.5 mm square glass capillary (see FIG. 1 and FIG. 2)
[Quantum Dot]
Red light-emitting quantum dots of core/shell structure (QY value; 83%) and green light-emitting quantum dots (QY value 80%, 81%)
[Dispersion Resin for Quantum Dots]
Silicone resin
Epoxy resin
[Capillary Sealing with Resin]
Sealing by vacuuming
[Total Luminous Flux Measurement]

Total luminous flux was measured with a capillary being pasted to a base of the light-guiding plate. In that case, three LED (driven at 20 mA) having a wavelength of 450 nm were lit as light sources. ASENSETEK lighting Passport was used as a spectroscope.

[Sample 1]

Using silicone resin as dispersion resin for quantum dots, silicone resin with dispersed quantum dots was sealed in the capillary. Note that the quantum dot concentration was set to a concentration in which absorbance became 15%.

[Sample 2]

Using epoxy resin as dispersion resin for quantum dots, epoxy resin with dispersed quantum dots was sealed in the capillary. Note that the quantum dot concentration was set to a concentration in which absorbance became 15%.

Example 1

In Example 1, a wavelength conversion member with no paint applied to the capillary (hereinafter referred to as "none_1"), a wavelength conversion member with white paint applied to an end portion of the light emission surface of the capillary (hereinafter referred to as "top_1") and a wavelength conversion member with white paint applied to the side face of the light emission surface of the capillary (hereinafter referred to as "side_1") and a wavelength conversion member with white paint applied from the side face of the light emission surface of the capillary to the end portion of the light emission surface (hereinafter referred to as "side+top_1") were prepared using sample 1.

Figure 13:
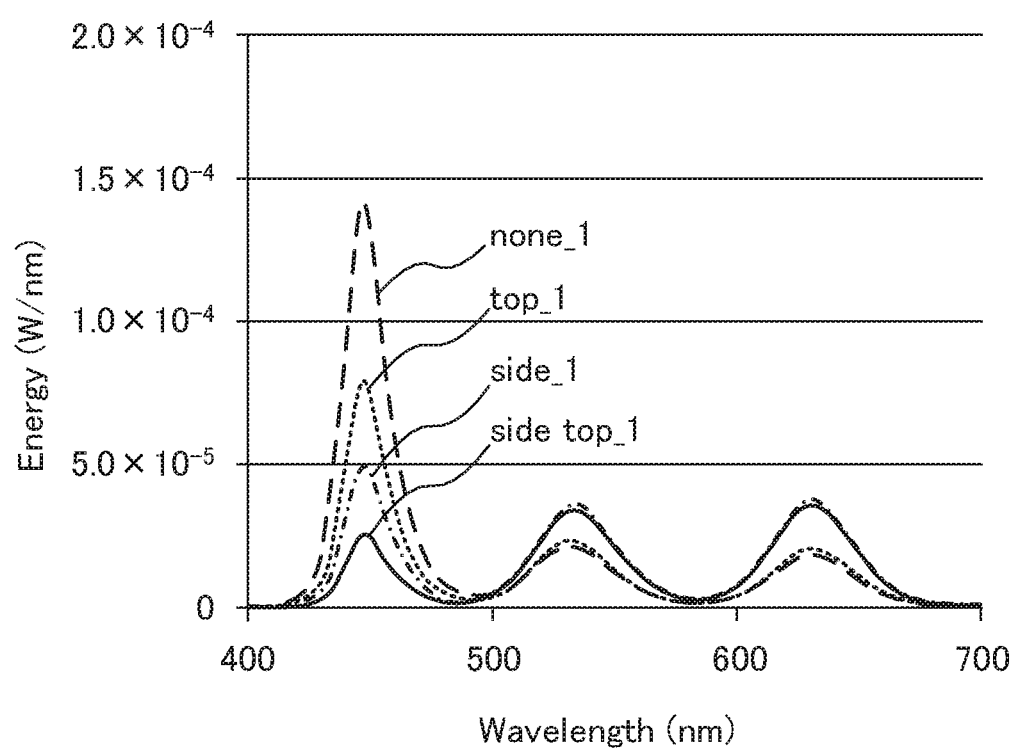
FIG. 13 is an emission spectrum according to Example 1.
Figure 14:
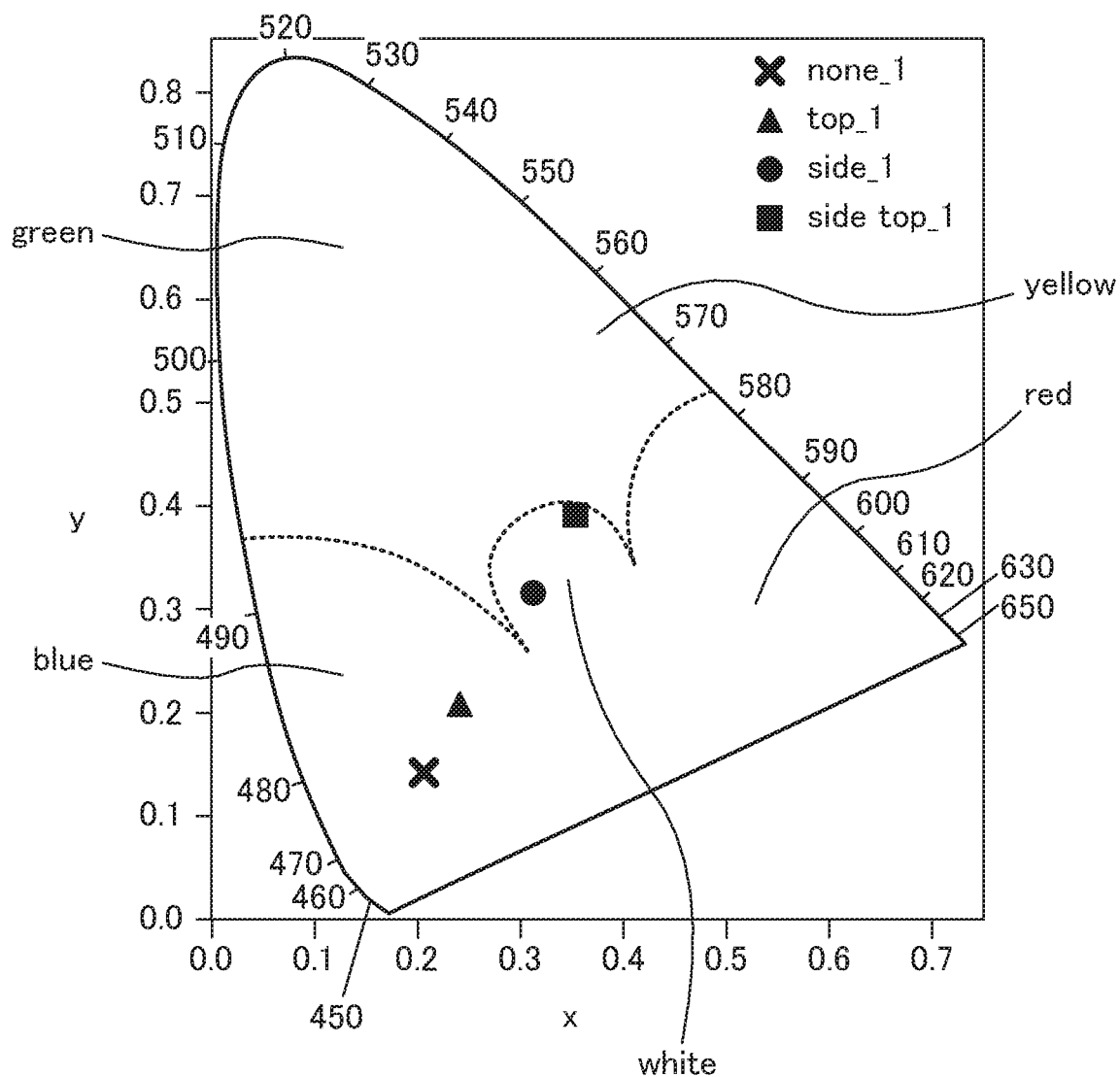
FIG. 14 is a chromaticity diagram according to Example 1.

An emission spectrum and a chromaticity diagram of light emitted from the surface (light emission surface) side of the light-guiding plate were obtained, and FIG. 13 and FIG. 14 show experiment results thereof.

As shown in FIG. 13, with none_1, a large peak was observed at a wavelength of approximately 450 nm (blue). It has been found that the peak at the wavelength of approximately 450 nm (blue) was able to be suppressed by applying white paint. It has been found that the peak at the wavelength of approximately 450 nm (blue) was able to be suppressed effectively by adopting side_1 or side+top_1 in particular.

Next, as shown in the chromaticity diagram in FIG. 14, it has been found that none_1 was blue, side_1 and side+top_1 were white or similar to white and top_1 showed a hue between none_1 and side_1.

Thus, with top_1, side_1 and side+top_1, the white paint suppresses leakage of light of blue light from the lateral region from the light incident surface to the light emission surface, and so the combined hole on the light emission surface can suppress the bluish tint more than the prior arts (none_1) and it was possible to obtain light in white or similar to white with side_1 and side+top_1 in particular. Moreover, with top_1, side_1 and side+top_1, it was possible to obtain light emission intensity of white light equal to or higher than none_1 and a significant increase in emission intensity of white light was observed particularly with side_1 more than none_1.

Example 2

In Example 2, a wavelength conversion member with no paint applied to the capillary (hereinafter referred to as "none_2"), a wavelength conversion member with silver paint applied to the end portion of the light emission surface of the capillary (top_2), a wavelength conversion member with silver paint applied to the side face of the light emission surface of the capillary (side_2) and a wavelength conversion member with silver paint applied onto the end portion of the light emission surface from the side face of the light emission surface of the capillary to the end portion of the light emission surface (side+top_2) were prepared using sample 1.

Figure 15:
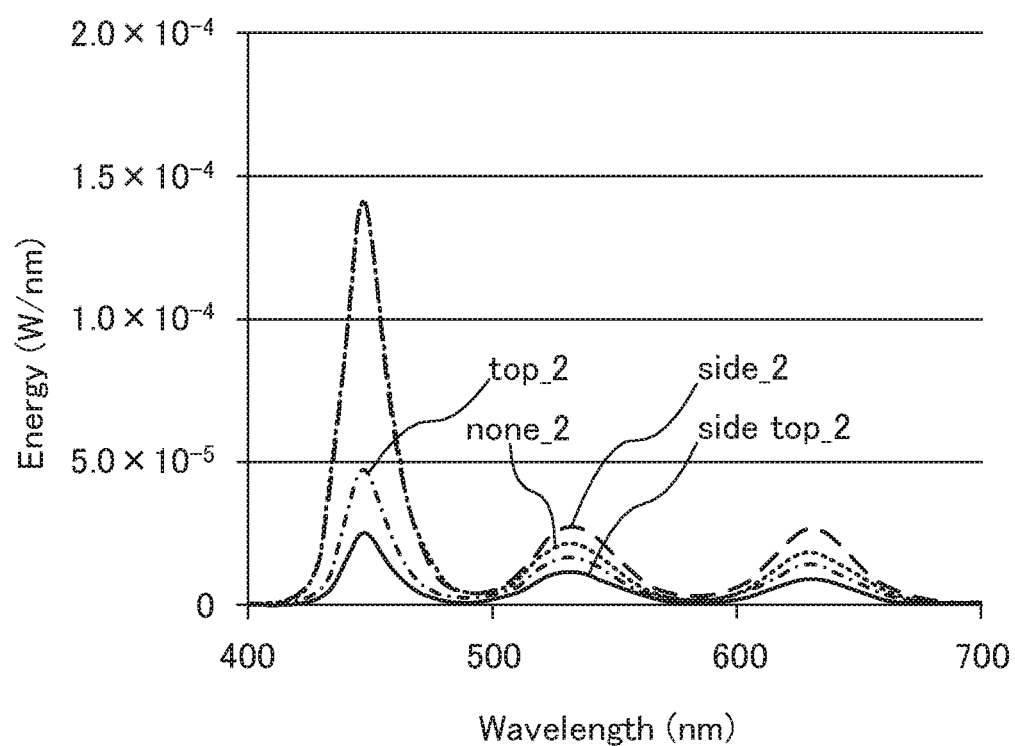
FIG. 15 is an emission spectrum according to Example 2.
Figure 16:
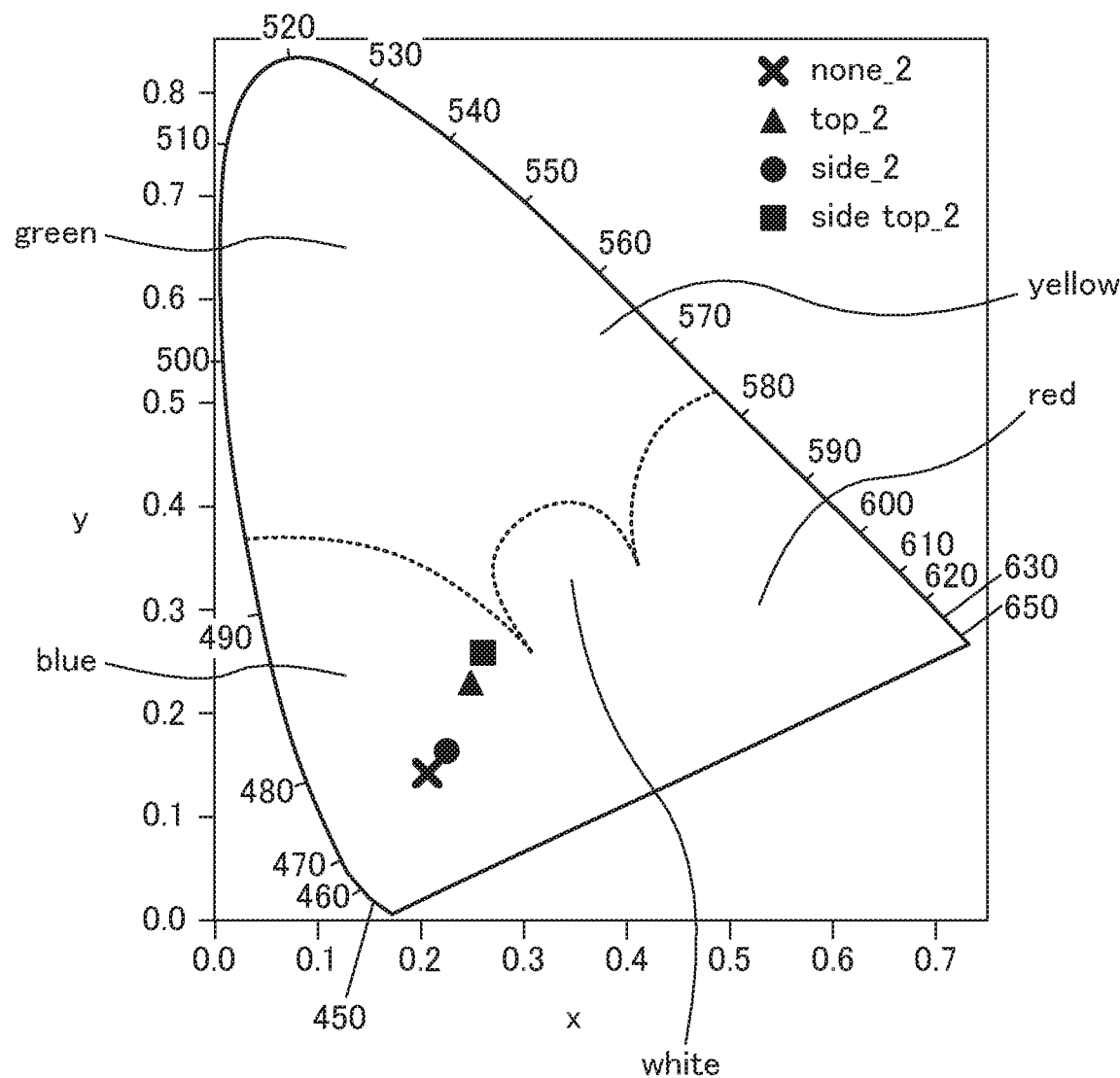
FIG. 16 is a chromaticity diagram according to Example 2.

Then, an emission spectrum and a chromaticity diagram of light emitted from the surface (light emission surface) side of the light-guiding plate were obtained. FIG. 15 and FIG. 16 show experiment results thereof.

As shown in FIG. 15, with none_2, a large peak was observed at a wavelength of approximately 450 nm (blue). On the other hand, it has been found that it is possible to effectively suppress the peak at a wavelength of approximately 450 nm (blue) by applying silver paint and using top_2 and side+top_2 in particular.

It is observed from the chromaticity diagram in FIG. 16 that by applying silver paint, the blue color is weakened compared to none_2 and the color becomes closer to white. In the present embodiment, greater effects were obtained in Example 1 with white paint applied than Example 2.

Example 3

In Embodiment 3, a wavelength conversion member with no paint applied to the capillary (none_3), a wavelength conversion member with white paint applied to the end portion of the light emission surface of the capillary (top_3), a wavelength conversion member with white paint applied to the side face of the light emission surface of the capillary (side_3), and a wavelength conversion member with white paint applied from the side face of the light emission surface of the capillary to the end portion of the light emission surface (side+top_3) were prepared using sample 2.

Figure 17:
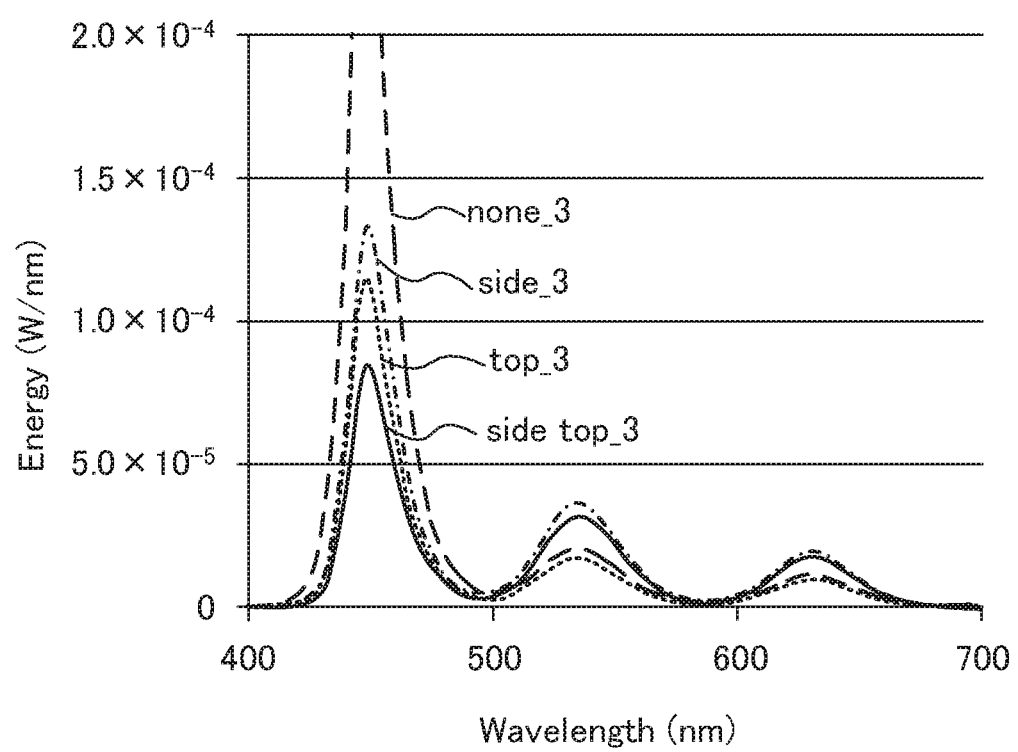
FIG. 17 is an emission spectrum according to Example 3.
Figure 18:
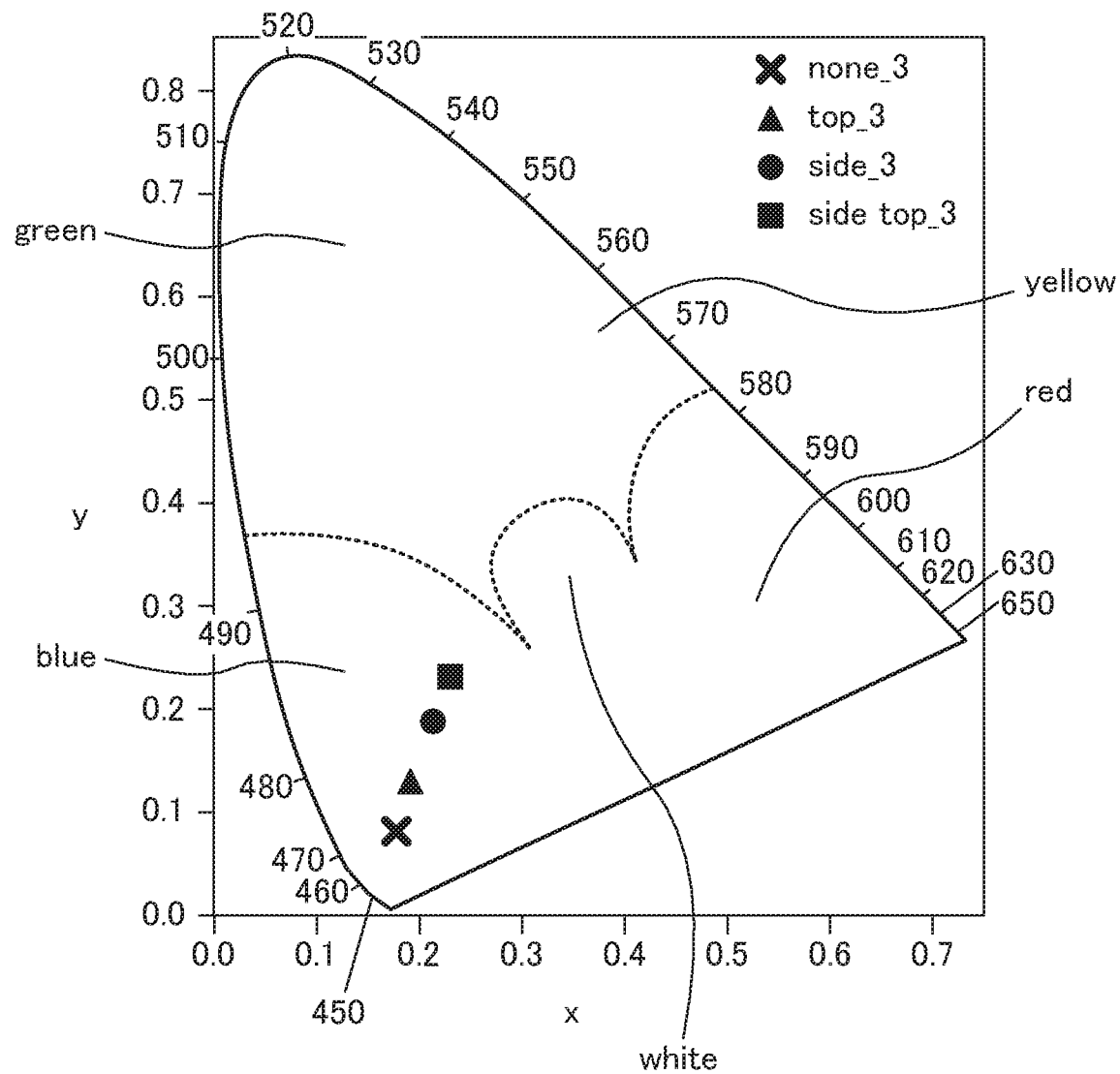
FIG. 18 is a chromaticity diagram according to Example 3.

Then, an emission spectrum and a chromaticity of light emitted from the surface (light emission surface) side of the light-guiding plate were obtained. FIG. 17 and FIG. 18 show experiment results thereof.

As shown in FIG. 17, with none_3, a large peak was observed at a wavelength of approximately 450 nm (blue). It has been found that it is possible to suppress the peak at the wavelength of approximately 450 nm (blue) by applying the white paint.

Next, as shown in the chromaticity diagram in FIG. 18, it has been found that by applying the white paint, the blue color is weekend compared to none_3 and the color approximates to the white, whereas using silicone resin as dispersion resin (see FIG. 14), it is possible to suppress the blue color compared to using epoxy resin and make the color closer to the white color.

[Sample 3]

Epoxy resin was used as the dispersion resin for quantum dots and epoxy resin in which quantum dots were dispersed was sealed in the capillary. The concentration of quantum dots in the dispersion resin was set to a concentration where absorbance became 20%.

[Sample 4]

Epoxy resin was used as the dispersion resin for quantum dots and epoxy resin in which quantum dots were dispersed was sealed in the capillary. The concentration of quantum dots in the dispersion resin was set to a concentration in which absorbance became 30%.

[Sample 5]

Using silicone resin as the dispersion resin for quantum dots, silicone resin in which quantum dots were dispersed was sealed in the capillary. The concentration of quantum dots in the dispersion resin was set to a concentration in which absorbance became 20%.

Comparative Example 1

In comparative example 1, a wavelength conversion member was prepared using sample 3 and with no paint applied to the capillary. A luminous flux was measured and Table 1 shows measurement results thereof.

TABLE 1

| Test Item | Data |
| --- | --- |
| CIE_x | 0.1919 |
| CIE_y | 0.1557 |
| Color temperature | N/A |
| Color region | N/A |
| Luminance (lux) | 3253 |
| CIE_u' | 0.1712 |
| CIE_v' | 0.3125 |
| Peak wavelength (nm) | 461 |
| Color purity | 66.3% |
| Qa | N/A |
| Amplitude of Blue | 1 |
| Amplitude of Green | 0.15196 |
| Amplitude of Red | 0.127367 |

Comparative Example 2

In comparative example 2, a wavelength conversion member was prepared using sample 4 and with no paint applied to the capillary. Table 2 below shows measurement results of performing luminous flux measurement.

TABLE 2

| Test Item | Data |
| --- | --- |
| CIE_x | 0.201 |
| CIE_y | 0.1606 |
| Color temperature | N/A |
| Color region | N/A |
| Luminance (lux) | 3180 |
| CIE_u' | 0.1776 |
| CIE_v' | 0.3194 |
| Peak wavelength (nm) | 461 |
| Color purity | 63% |
| Qa | N/A |
| Amplitude of Blue | 1 |
| Amplitude of Green | 0.15937 |
| Amplitude of Red | 0.156634 |

Examples 3 to 5

In Examples 3 to 5, a wavelength conversion member was prepared using sample 1 for each example and with white paint applied to the side face of the capillary. Measurement positions for measuring the luminous flux were changed among Examples 3 to 5. The vicinity of the center of the light-guiding plate was selected as the measurement position in Example 4, whereas positions on both sides of the light-guiding plate were selected as the measurement positions in Example 3 and Example 5.

Table 3 below shows the measurement results of Example 3, Table 4 below shows the measurement results of Example 4 and Table 5 below the measurement results of Example 5.

TABLE 3

| Test Item | Data |
| --- | --- |
| CIE_x | 0.3602 |
| CIE_y | 0.3944 |
| Color temperature | 4671 |
| Color region | 73 |
| Luminance (lux) | 2238 |
| CIE_u' | 0.2055 |
| CIE_v' | 0.5062 |
| Peak wavelength (nm) | 635 |
| Color purity | 26.50% |
| Qa | 83.1 |
| Amplitude of Blue | 0.634135 |
| Amplitude of Green | 0.860425 |
| Amplitude of Red | 1 |

TABLE 4

| Test Item | Data |
| --- | --- |
| CIE_x | 0.3186 |
| CIE_y | 0.351 |
| Color temperature | 6098 |
| Color region | 79 |
| Luminance (lux) | 457 |
| CIE_u' | 0.1938 |
| CIE_v' | 0.4805 |
| Peak wavelength (nm) | 461 |
| Color purity | 4.50% |
| Qa | 85.1 |
| Amplitude of Blue | 1 |
| Amplitude of Green | 0.871293 |
| Amplitude of Red | 0.882989 |

TABLE 5

| Test Item | Data |
| --- | --- |
| CIE_x | 0.3151 |
| CIE_y | 0.3505 |
| Color temperature | 6255 |
| Color region | 80 |
| Luminance (lux) | 378 |
| CIE_u' | 0.1917 |
| CIE_v' | 0.4797 |
| Peak wavelength (nm) | 461 |
| Color purity | 5.50% |
| Qa | 85 |
| Amplitude of Blue | 1 |
| Amplitude of Green | 0.861435 |
| Amplitude of Red | 0.84456 |

Examples 6 to 8

In Examples 6 to 8, a wavelength conversion member was prepared using sample 5 for each example and with white paint applied to the side face of the capillary. Measurement positions for measuring the luminous flux were changed among Examples 6 to 8. The vicinity of the center of the light-guiding plate was selected as the measurement position in Example 7, whereas positions on both sides of the light-guiding plate were selected as the measurement positions in Example 6 and Example 8.

Table 6 below shows the measurement results of Example 6, Table 7 below shows the measurement results of Example 7 and Table 8 below the measurement results of Example 8.

TABLE 6

| Test Item | Data |
| --- | --- |
| CIE_x | 0.375 |
| CIE_y | 0.4258 |
| Color temperature | 4425 |
| Color region | 74 |
| Luminance (lux) | 2183 |
| CIE_u' | 0.2038 |
| CIE_v' | 0.5207 |
| Peak wavelength (nm) | 636 |
| Color purity | 40.40% |
| Qa | 81.8 |
| Amplitude of Blue | 0.469627 |
| Amplitude of Green | 0.899313 |
| Amplitude of Red | 1 |

TABLE 7

| Test Item | Data |
| --- | --- |
| CIE_x | 0.3386 |
| CIE_y | 0.3842 |
| Color temperature | 5305 |
| Color region | 77 |
| Luminance (lux) | 509 |
| CIE_u' | 0.1954 |
| CIE_v' | 0.4987 |
| Peak wavelength (nm) | 637 |
| Color purity | 17% |
| Qa | 84 |
| Amplitude of Blue | 0.835518 |
| Amplitude of Green | 0.993547 |
| Amplitude of Red | 1 |

TABLE 8

| Test Item | Data |
| --- | --- |
| CIE_x | 0.3327 |
| CIE_y | 0.3772 |
| Color temperature | 5500 |
| Color region | 78 |
| Luminance (lux) | 411 |
| CIE_u' | 0.194 |
| CIE_v' | 0.4948 |
| Peak wavelength (nm) | 539 |
| Color purity | 13.20% |
| Qa | 84.2 |
| Amplitude of Blue | 0.899249 |
| Amplitude of Green | 1 |
| Amplitude of Red | 0.979117 |

It has been found from the above experiment results that it is possible to set the x-coordinate of the chromaticity diagram in the example to 0.30 to 0.40, the y-coordinate to 0.35 to 045, and the color temperature to on the order of 4000 K to 6500 K.

INDUSTRIAL APPLICABILITY

The present invention can implement an LED, a backlight apparatus, a display apparatus or the like using a wavelength conversion member obtained by sealing a wavelength conversion substance in a container. According to the wavelength conversion member of the present invention, it is possible to perform color conversion appropriately and with high efficiency, and thereby reduce power consumption of the LED, the backlight apparatus, the display apparatus or the like using the wavelength conversion member of the present invention.

The present application is based on Japanese Patent Application No. 2014-169531 filed on Aug. 22, 2014, entire content of which is expressly incorporated by reference herein.

The invention claimed is:

1. A wavelength conversion member comprising:
   a container comprising a light incident surface, a light emission surface facing the light incident surface, and a side face connecting the light incident surface and the light emission surface, the container being provided with a storage space that is at least inside the side face;
   a wavelength conversion substance disposed in the storage space; and
   a colored layer disposed on the side face and extending onto an end portion of the light emission surface, the end portion facing the light incident surface and a lateral region of the container, the lateral region of the container being between the storage space and the side face,
   wherein the colored layer is formed directly on the container without extending to a position on the light emission surface that faces the wavelength conversion substance.

2. The wavelength conversion member according to claim 1, wherein the wavelength conversion substance contains quantum dots.

3. The wavelength conversion member according to claim 2, wherein the wavelength conversion substance is formed of a resin composition in which the quantum dots are dispersed.

4. The wavelength conversion member according to claim 3, wherein the wavelength conversion substance is formed of a resin composition in which the quantum dots are dispersed in silicone resin.

5. The wavelength conversion member according to claim 2, wherein
   the quantum dots include two types of quantum dots,
   the two types including a first type of quantum dots having an absorption wavelength of 460 nm and a fluorescence wavelength of 520 nm, and a second type of quantum dots having a fluorescence wavelength of 660 nm.

6. The wavelength conversion member according to claim 1, wherein outer shape cross sections of the storage space and the container obtained by cutting the light incident surface and the light emission surface by a plane perpendicular to at least one of the light incident surface and the light emission surface are rectangular.

7. The wavelength conversion member according to claim 1, wherein the colored layer is colored in white color.

8. The wavelength conversion member according to claim 1, wherein the colored layer is formed of paint, ink or tape.

9. The wavelength conversion member according to claim 1, wherein the refractive index of the dispersion resin that forms the wavelength conversion substance is smaller than the refractive index of the container.

10. A light-emitting apparatus comprising a light-emitting element provided opposite to the light incident surface and the wavelength conversion member according to claim 1, the wavelength conversion member being disposed on a light emission side of the light-emitting element.

11. A light source apparatus comprising the light-emitting apparatus according to claim 10 and a light-guiding plate.

12. A display apparatus comprising a display section, and the light-emitting apparatus according to claim 10, the light-emitting apparatus being disposed on a rear surface side of the display section.

13. A light-emitting element comprising a light-emitting chip that emits blue light and the wavelength conversion member according to claim 1, the wavelength conversion member being disposed on a light emission side of the light-emitting chip.

14. The wavelength conversion member according to claim 1, wherein the colored layer covers at least 50% of the side face or at least 50% of the end portion of the light emission surface.

15. The wavelength conversion member according to claim 1, wherein the colored layer and the wavelength conversion substance are spaced from one another such that they do not contact one another.

16. The wavelength conversion member according to claim 1, wherein the container is disposed between the colored layer and the wavelength conversion substance.

17. The wavelength conversion member according to claim 1, wherein the container is a singular integrated structure.

18. The wavelength conversion member according to claim 1, wherein the colored layer is a paint coating, an ink coating, tape, or vapor-deposited.

19. The wavelength conversion member according to claim 1, wherein an entirety of the colored layer is directly on the container.

20. A wavelength conversion member comprising:

a container comprising a light incident surface, a light emission surface facing the light incident surface, and a side face connecting the light incident surface and the light emission surface, the container being provided with a storage space that is at least inside the side face;

a wavelength conversion substance disposed in the storage space; and a colored layer disposed on the side face and extending onto an end portion of the light emission surface, the end portion facing the light incident surface and a lateral region of the container, the lateral region of the container being between the side face of the container and the storage space, wherein the colored layer is formed directly on the container without extending to a position on the light emission surface that faces the wavelength conversion substance, wherein a refractive index of dispersion resin that forms the wavelength conversion substance is 1.41 through 1.55, and wherein a refractive index of the container is 1.45 through 1.90.

* * * * *